United States Patent
Li (10) Patent No.: US 7,345,598 B2
(45) Date of Patent: Mar. 18, 2008

(54) ELECTRONIC DEVICE WITH KEYBOARD SYSTEM AND METHOD OF DETECTING KEY CONDITIONS THEREOF

(75) Inventor: Ying-Chieh Li, Taipei (TW)

(73) Assignee: Wistron Corp., Hsichih, Taipei Hsien (TW)

( * ) Notice: Subject to any disclaimer, the term of this patent is extended or adjusted under 35 U.S.C. 154(b) by 245 days.

(21) Appl. No.: 11/183,832

(22) Filed: Jul. 19, 2005

(65) Prior Publication Data
US 2006/0232446 A1    Oct. 19, 2006

(30) Foreign Application Priority Data
Apr. 19, 2005   (TW) .............................. 94112412 A (51) Int. Cl.
*H03K 17/94* (2006.01)
(52) U.S. Cl. ..................... 341/22; 341/26; 400/472
(58) Field of Classification Search .............. 341/22, 341/26; 400/472; 700/84
See application file for complete search history.

(56) References Cited

U.S. PATENT DOCUMENTS

| 5,659,308 A | * | 8/1997 | Goff | ..................... | 341/26 |
| 6,191,709 B1 | * | 2/2001 | Cho | ..................... | 341/26 |
| 6,574,517 B1 | * | 6/2003 | Park et al. | ..................... | 700/84 |
| 2003/0030574 A1 | * | 2/2003 | Chien | ..................... | 341/22 |
| 2004/0086314 A1 | * | 5/2004 | Chen et al. | ..................... | 400/472 |

FOREIGN PATENT DOCUMENTS

TW            502199           9/2002

* cited by examiner

*Primary Examiner*—Timothy Edwards, Jr.
(74) *Attorney, Agent, or Firm*—Bacon & Thomas, PLLC (57) ABSTRACT

The present invention provides an electronic device and its keyboard system that includes a plurality of keys, a keyboard matrix and a program. The keys include a plurality of first type keys and a plurality of second type keys; the keyboard matrix includes a plurality of keyboard positions. By scanning the keyboard positions, a character or a command typed by a user can be obtained; the program includes a first program code for setting the keyboard matrix to cause a portion of the matrix positions to correspond to the plurality of first type keys, wherein each matrix position corresponding to one first type key, and a second program code for setting another portion of the matrix positions corresponding to the plurality of second type keys, wherein each matrix position corresponding to more than one second type keys.

20 Claims, 8 Drawing Sheets

ELECTRONIC DEVICE WITH KEYBOARD SYSTEM AND METHOD OF DETECTING KEY CONDITIONS THEREOF

BACKGROUND OF THE INVENTION

1. Field of the Invention

The present invention relates to an electronic device and its associated keyboard system and, more particularly, to an electronic device and its associated keyboard system that is capable of corresponding one keyboard matrix position to a plurality of keys.

2. Description of the Related Art

Keyboards are very important data input devices for computer systems; a user can input characters or commands by pressing keys on the keyboard to execute various functions of the computer system.

Generally, the prior art technology scans a keyboard matrix to obtain the operating condition of every key on the keyboard. The keyboard matrix is composed of line conductors and column conductors, and the crossing point of each line conductor and column conductor corresponds to a key. Every key is a switch, and when one key is pressed, the corresponding crossing point of the corresponding line conductor and corresponding column conductor is electrically connected.

Therefore, by scanning the keyboard matrix, the connected crossing points can be found to record the pressed key and send a corresponding scan code, which indicates the key that is pressed, to a host system of the computer for further processing, such as displaying the associated character on a computer display.

Figure 1:
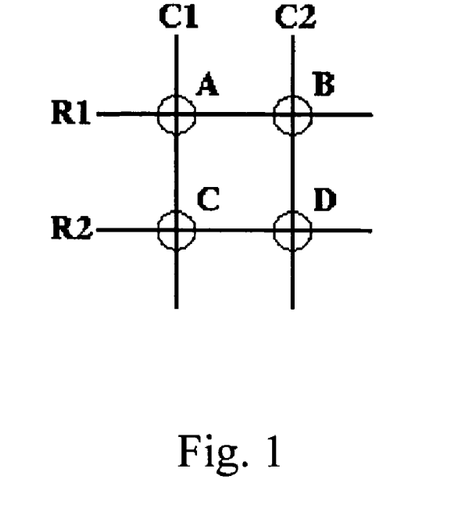
FIG. 1 is a schematic drawing of a prior art keyboard matrix.

Please refer to FIG. 1. FIG. 1 is a schematic drawing of a prior art keyboard matrix. A keyboard has only four keys: A, B, C and D, and every key has its own matrix position (which is the crossing point of the line conductor and the column conductor). For example, key A is located at matrix position C1R1, key B is located at matrix position C2R1, key C is located at matrix position C1R2, and key D is located at matrix position C2R2.

When key A is pressed, conductor C1 and conductor R1 are electrically connected. When a keyboard controller scans and detects both conductor C1 and conductor R1 are activated, it learns that key A is pressed.

According to FIG. 1, one key corresponds to one keyboard matrix position, and therefore the total number of keys on the keyboard is determined by the size of the keyboard matrix. For example, in order to place 104 keys on a keyboard, there must be at least an 8×13 keyboard matrix. An even larger sized keyboard matrix is required for more keys.

Usually, the design of the typical keyboard matrix has an 8×16 or 8×18 matrix, which is respectively able to support at least 128 or 144 keys. For the keyboard manufacturer, the 8×16 keyboard matrix can only accept 128 keys on the keyboard at a maximum. For more than 128 keys, the manufacturer needs to use a larger keyboard matrix, which will increase design and manufacturing costs.

Accordingly, the typical notebook can support 128 keys or 144 keys. However, some new keyboard designs need more than 128 keys or 144 keys, and so the 8×16 keyboard matrix or the 8×18 keyboard matrix is not suitable.

Therefore, in order to overcome the prior art and let the software or hardware change on the keyboard be minimum, it is desirable to provide a keyboard system that can provide matrix positions in the keyboard matrix that correspond to more than one keys so that the prior art keyboard matrix (such as 8×16 keyboard matrix) can be utilized for more than 128 keys to mitigate and/or obviate the aforementioned design and manufacturing cost problems.

SUMMARY OF THE INVENTION

An objective of the present invention is to provide an electronic device and its associated keyboard system that is capable of corresponding one keyboard matrix position to a plurality of keys.

The electronic device comprises a host system; a keyboard system adapted for electrical connection to the host system to execute a program to obtain at least one character inputted by the user; and a display system for displaying the character.

The keyboard system comprises: a plurality of keys for inputting at least one character or command, and the plurality of keys comprises a plurality of first type keys and a plurality of second type keys; a keyboard matrix comprises a plurality of matrix positions, the plurality of keys corresponding to the plurality of matrix positions, and the at least one character inputted by the plurality of keys is obtainable by scanning the matrix positions; a program comprises: a first program code for causing a portion of the matrix positions to correspond to the plurality of first type keys, each matrix position corresponding to one first type key; and a second program code for causing another portion of the matrix positions to correspond to the plurality of second type keys, each matrix position corresponding to more than one second type keys.

In one embodiment of the present invention, wherein the keyboard matrix is composed of a plurality of conductor lines and a plurality of conductor columns, wherein a crossing point of each conductor line and each conductor column defines a matrix position to form the plurality of matrix positions.

In one embodiment of the present invention, every first type key corresponds to a first scan code, every second type key corresponds to a second scan code, and the program further comprises:

a third program code for obtaining a key condition of every key in the plurality of first type keys;

a fourth program code for determining whether any key in the plurality of first type keys is pressed;

a fifth program code for looking for the first scan code corresponding to the pressed key in the plurality of first type keys;

a sixth program code for sending out the first scan code corresponding to the pressed key in the plurality of first type keys;

a seventh program code for obtaining a key condition of every key in the plurality of second type keys;

an eighth program code for determining whether any key in the plurality of second type keys is pressed;

a ninth program code for looking for the second scan code corresponding to the pressed key in the plurality of second type keys;

a tenth program code for sending out the second scan code corresponding to the pressed key in the plurality of second type keys; and an eleventh program code for combining the key condition of every key in the plurality of first type keys and the key condition of every key in the plurality of second type keys, enabling the fourth program code and the eighth program code to determine whether any key in the plurality of first type keys is pressed and whether any key in the plurality of second type keys is pressed.

The present invention further provides a detecting method for key conditions for an electronic device, the method comprises:

setting a keyboard matrix to cause a portion of its matrix positions to correspond to the plurality of first type keys, each matrix position corresponding to one first type key; and another portion of the matrix positions corresponding to the plurality of second type keys, each matrix position corresponding to more than one second type keys;

obtaining a key condition of every key in the plurality of first type keys;

determining whether any key in the plurality of first type keys is pressed;

looking for the first scan code corresponding to the pressed key in the plurality of first type keys;

sending out the first scan code corresponding to the pressed key in the plurality of first type keys;

obtaining a key condition of every key in the plurality of second type keys;

determining whether any key in the plurality of second type keys is pressed;

looking for the second scan code corresponding to the pressed key in the plurality of second type keys;

sending out the second scan code corresponding to the pressed key in the plurality of second type keys; and combining the key condition of every key in the plurality of first type keys and the key condition of every key in the plurality of second type keys, for determine whether any key in the plurality of first type keys is pressed and whether any key in the plurality of second type keys is pressed.

In one embodiment of the present invention, the step of obtaining a key condition of every key in the plurality of second type keys further comprises: obtaining a current key condition of every key in the plurality of second type keys; and obtaining an original key condition of every key in the plurality of second type keys.

In one embodiment of the present invention, determining whether any key in the plurality of second type keys is pressed further comprises:

comparing the current key condition and the original key condition to determine whether these two have changed; if they have not, ending the detection method; and if they have, recording change values of the current key condition and the original key condition.

In one embodiment of the present invention, in the step of comparing the current key condition and the original key condition, an XOR operation is performed on the current key condition and the original key condition, and an XOR operational result of 1 indicating that the current key condition and the original key condition have changed.

In one embodiment of the present invention, in the step of looking for the second scan code corresponding to the pressed key, the second scan code corresponding to the pressed key in the plurality of second type keys has an XOR operational result of 1.

Other objects, advantages, and novel features of the invention will become more apparent from the following detailed description when taken in conjunction with the accompanying drawings.

DETAILED DESCRIPTION OF THE PREFERRED EMBODIMENT

Figure 2:
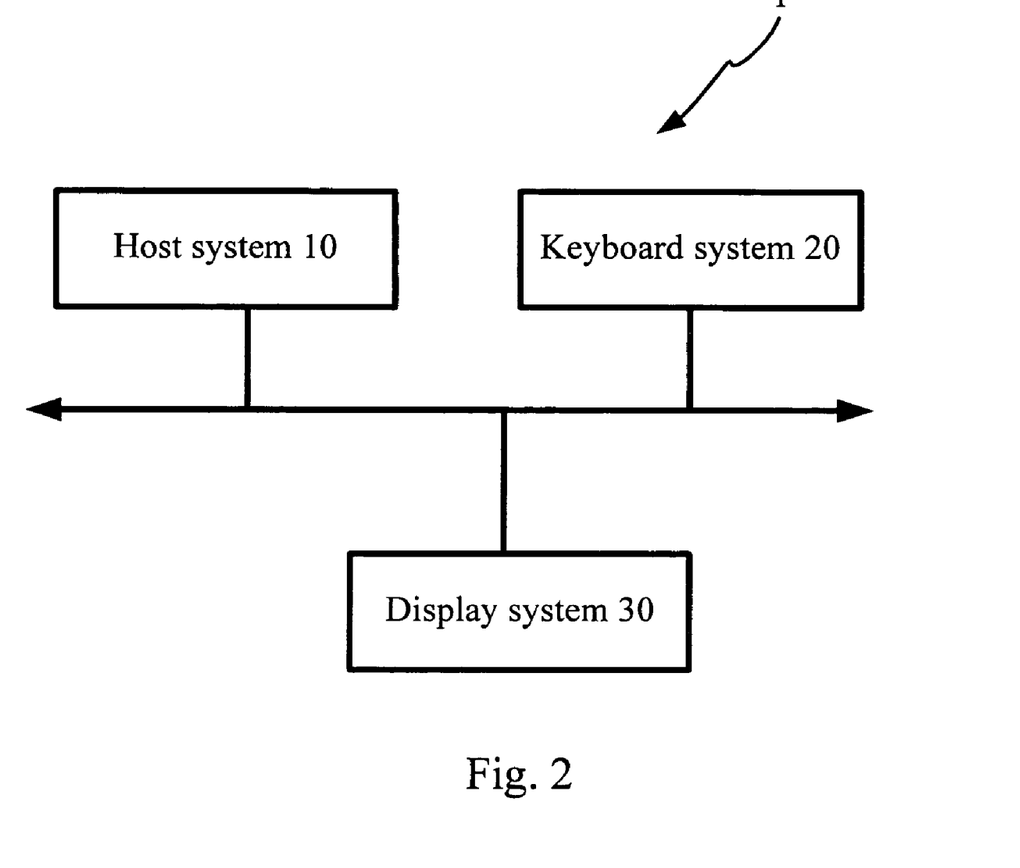
FIG. 2 is a structural schematic drawing of an electronic device of the present invention.

Please refer to FIG. 2. FIG. 2 is a structural schematic drawing of an electronic device of the present invention. As shown in the drawing, an electronic device 1 comprises a host system 10, a keyboard system 20, and a display system 30. A user can key characters or commands into the host system 10 via the keyboard system 20, and then the host system 10 processes the characters or commands to display them on the display system 30. In an embodiment of the present invention, the electronic device 1 can be a notebook computer, a desktop computer, a PDA, a mobile phone or any electronic device with a host system, a keyboard system and a display system.

In the prior art keyboard system, one matrix position corresponds to only one key, and therefore, the size of the keyboard matrix determines the total number of keys on the keyboard. However, in the keyboard system 20 of the electronic device 10, one matrix position can correspond to several keys, and so the keyboard system can have more keys without changing the size of the keyboard matrix.

For example, in the prior art, the keyboard matrix may be an 8×16 keyboard, which only has 128 matrix positions for 128 keys. If this keyboard matrix already has 115 keys on it, then only 13 more keys can be installed on it.

However, in the present invention the same 8×16 keyboard matrix can have more than 128 keys. Therefore, if this keyboard matrix already has 115 keys on it, then there can be more than 13 keys installed on it.

The following description explains how to add 16 more keys onto an 8×16 keyboard matrix that already has 115 keys.

Figure 3:
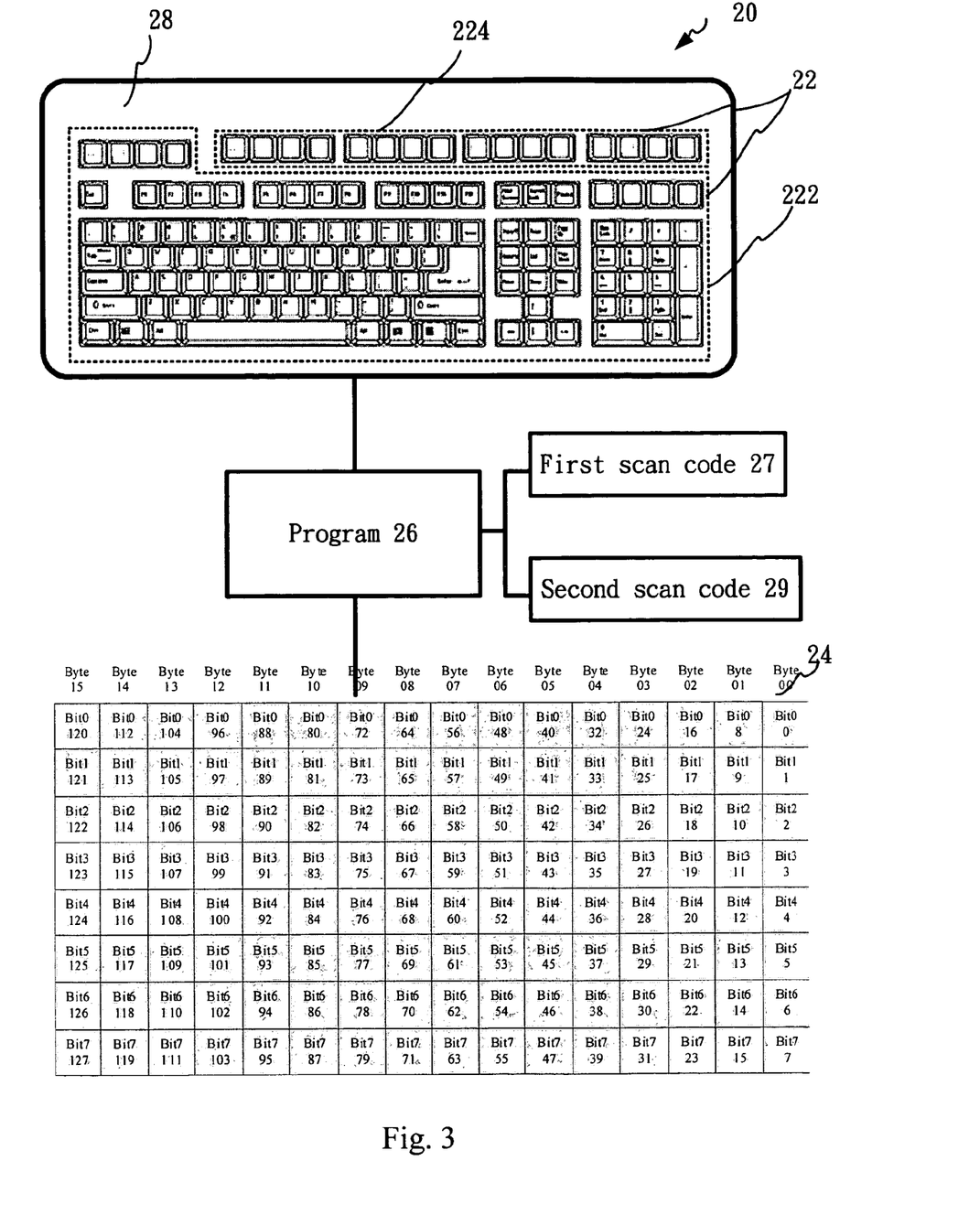
FIG. 3 is a structural schematic drawing of a keyboard system according to the present invention.

Please refer to FIG. 3. FIG. 3 is a structural schematic drawing of a keyboard system according to the present invention. The keyboard system 20 of the present invention has 131 keys 22 electrically connected to each other, a keyboard matrix 24 and a program 26. As shown in the drawing, all 131 keys can be placed on a keyboard housing 28, or some of the keys can be placed on the host system 10, the display system 30 or any place of the electronic device 1, so long as the 131 keys 22 are electrically connected to the keyboard matrix 24 and the program 26.

As shown in FIG. 3, the keyboard matrix 24 is composed of 8 lines and ×16 columns; a crossing point of every line and every column defines a matrix position, and so there are 128 matrix positions. As shown in FIG. 3, these 128 matrix positions can be represented by 16 bytes, which is 128 bits; in other words, each bit represents one matrix position, from a matrix position 0 to a matrix position 127. When the key condition of the key corresponding to the matrix position is changed, the bit value of the matrix position will correspondingly changed as well.

As shown in FIG. 3, 131 keys 22 in the present invention correspond to the matrix position 0 to the matrix position 127. These 131 keys 22 comprises 115 first type keys 222 (the original keys) and 16 second type keys 224 (the newly added keys), wherein every first type key 222 corresponds to a first scan code 27 by the program 26, and every second type key 224 corresponds to a second scan code 29 by the program 26 as well. By scanning from the matrix position 0 to the matrix position 127, the first scan code 27 and/or the second scan code 29 can be obtained, and so the key condition (whether the key is pressed or not) of every key in these 131 keys 22 can be used for obtaining characters or commands inputted by a user.

As shown in FIG. 3, every key of the 115 first type keys 222 is similar to the prior art keys, that is, each key corresponds to one matrix position; however, the 16 second type keys 224 are different from the prior art keys, that is, more than one keys can correspond to one matrix position. Therefore, the 115 first type keys 222 are identical to prior art keys, and the 16 second type keys 224 are newly added keys.

As shown in FIG. 3, 131 keys 22 have 115 first type keys 222 and 16 second type keys 224. The 115 first type keys 222 have a "one to one" correspondence with the 115 matrix positions from the matrix position 0 to the matrix position 127. For example, in one embodiment of the present invention, the 115 first type keys 222 correspond to the matrix position 0 to the matrix position 114.

The other 16 second type keys 222 have a "plurality to one" correspondence with at least one matrix position from the matrix position 0 to the matrix position 127. For example, in one embodiment of the present invention, the other 16 second type keys 224 all correspond to the matrix position 127.

Therefore, the prior art 8×16 keyboard matrix can be used for the placing of 131 keys, which include 115 original keys and 16 newly added keys.

Figure 4:
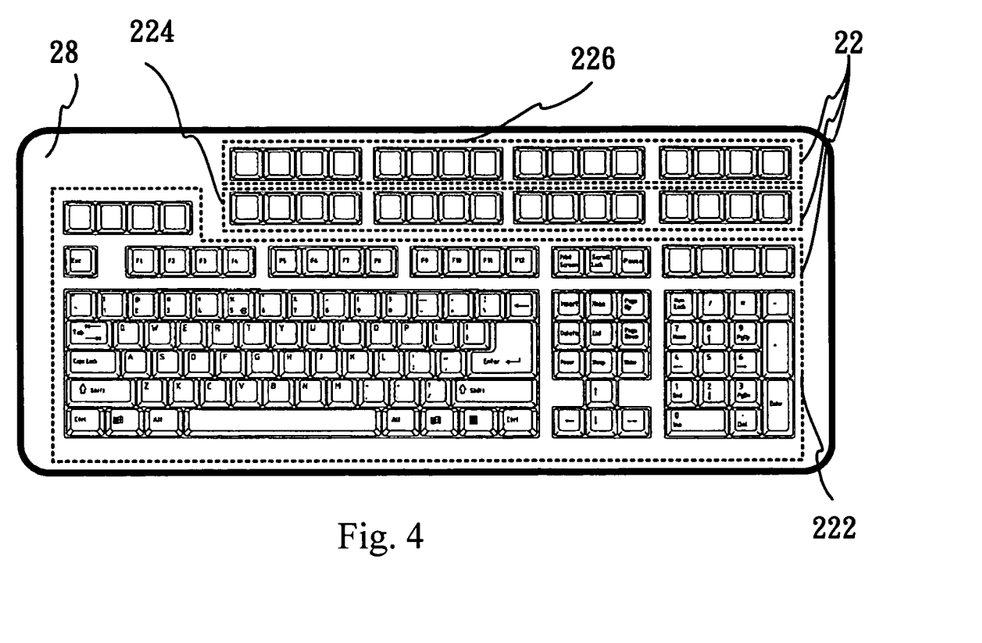
FIG. 4 is a schematic drawing of a key layout of the keyboard system according to the present invention.

Therefore, in order to add more new keys onto the previous keyboard matrix, the second type key 224 can be utilized. For example, there are no keys corresponding to matrix position 115 to matrix position 126, and so the newly added keys can correspond to these matrix positions. As shown in FIG. 4, 16 more second type keys 226 can correspond to the unused matrix position 115, and therefore there are 147 keys total on this 8×16 keyboard matrix.

As shown in FIG. 3, the present invention utilizes the program 26 to achieve the above-mentioned process. The program 26 is controlled by the host system 10, so that the 131 keys 22 can correspond to the matrix position 0 to the matrix position 127, and the key condition of every key can be obtained to obtain the first scan code 27 and/or the second scan code 29.

Figure 5:
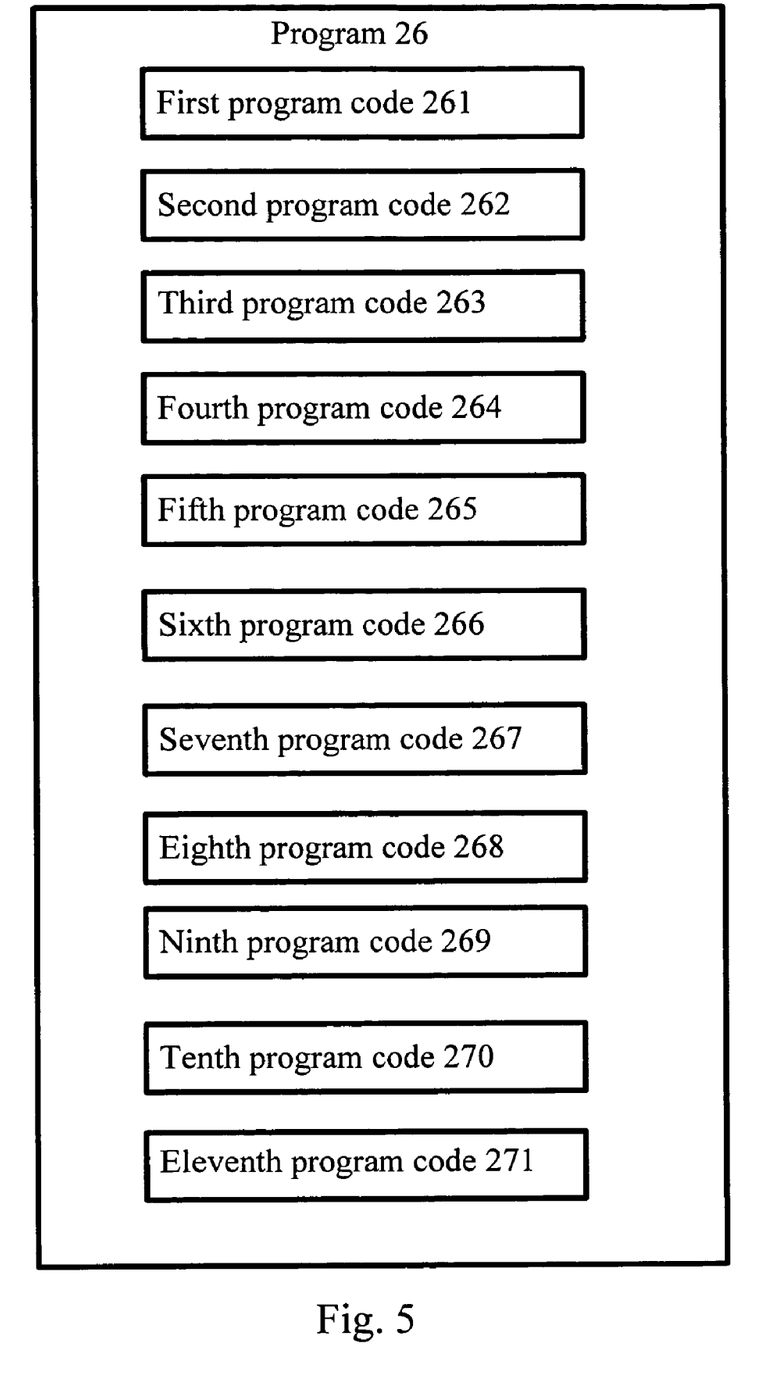
FIG. 5 is a schematic drawing of program codes in a program according to the present invention.

Please refer to FIG. 5. FIG. 5 is a schematic drawing of program codes in a program according to the present invention.

The program 26 comprises:

a first program code 261, which is used for causing at least a portion of the matrix positions from the matrix position 0 to the matrix position 127 to correspond to the plurality of first type keys 222, and every matrix position corresponds to one first type key 222; for example, as shown in FIG. 3, the matrix position 0 to the matrix position 114 separately correspond to 115 first type keys 222;

a second program code 262, which is used for causing another portion of the matrix positions from the matrix position 0 to the matrix position 127 to correspond to the plurality of second type keys 224, and every matrix position corresponds to more than one second type keys 224; for example, as shown in FIG. 3, the matrix position 127 corresponds to all 16 second type keys 224;

a third program code 263, which is used for obtaining a key condition of every key in the plurality of first type keys 222;

a fourth program code 264, which is used for determining whether any key in the plurality of first type keys 222 is pressed;

a fifth program code 265, which is used for looking for the first scan code 27 corresponding g to the pressed key in the plurality of first type keys 222;

a sixth program code 266, which is used for sending out the first scan code 27 to the host system 10 for further processing;

a seventh program code 267, which is used for obtaining a key condition of every key in the plurality of second type keys 224;

an eighth program code 268, which is used for determining whether any key in the plurality of second type keys 224 is pressed;

a ninth program code 269, which is used for looking for the second scan code 29 corresponding to the pressed key in the plurality of second type keys 224;

a tenth program code 270, which is used for sending out the second scan code 29 to the host system 10 for further processing; and an eleventh program code 271, which is used for combining the key condition of every key in the plurality of first type keys 222 and the key condition of every key in the plurality of second type keys 224, so that the fourth program code 264 and the eighth program code 268 can determine whether any key in the plurality of first type keys 222 is pressed and whether any key in the plurality of second type keys 224 is pressed.

By utilizing the program 26, the keyboard system 20 provided by the present invention can have more keys than the original keyboard matrix without changing any hardware, thus saving manufacturing costs. However, the above-mentioned program codes are just for one embodiment of the present invention, and are not all required by the present invention. For example, even without the eleventh program code 271, the present invention can still provide the same functionality.

The present invention further provides a detecting method for the key conditions for the electronic device 1 and the keyboard system 20, to detect the key conditions to execute commands inputted by the user, or to display characters inputted by the user on the display system 30.

Figure 6:
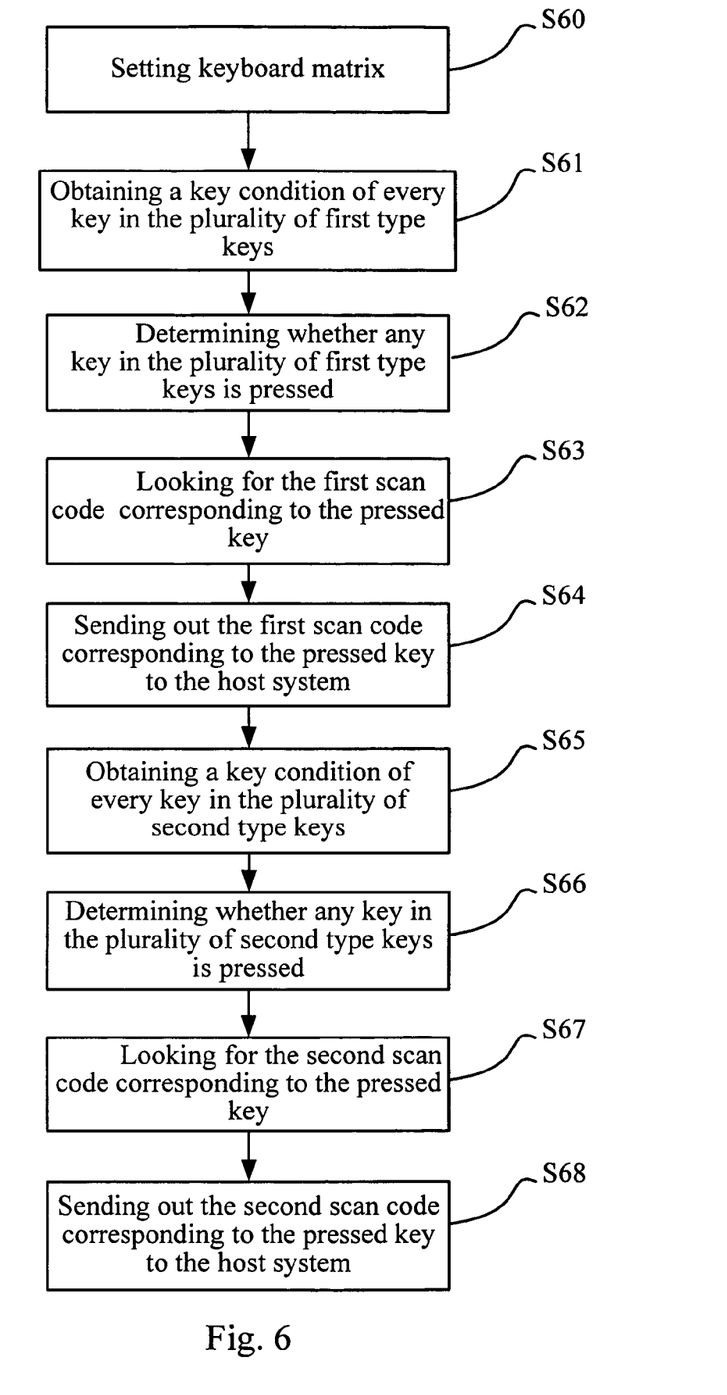
FIG. 6 is a flowchart of a detecting method for key conditions according to the present invention.

Please refer to FIG. 6. FIG. 6 is a flowchart of a detecting method for key conditions according to the present invention. Step S60 is executed to set the keyboard matrix 24 to cause a portion of the matrix positions of the keyboard matrix 24 to correspond to a plurality of first type keys 222, with every matrix position corresponding to one first type key 222; and another portion of the matrix positions of the keyboard matrix 24 corresponding to the plurality of second type keys 224, with each matrix position corresponding to more than one second type keys 224.

Step S61 is executed to obtain a key condition of every key in the plurality of first type keys 222.

After obtaining the key condition, step S62 is executed to determine whether any key in the plurality of first type keys 222 is pressed.

When one key in the plurality of first type keys 222 is pressed, step S63 is executed to look for the first scan code 27 corresponding to the pressed key.

Next, step S64 is executed to send out the first scan code 27 corresponding to the pressed key to the host system 10 for further processing.

The present invention thus finishes the key conditions detection process for the plurality of first type keys 222.

Then, the present invention performs the key condition detection process for the plurality of second type keys 224.

Step S65 is executed to obtain a key condition of every key in the plurality of second type keys 224.

After obtaining the key condition, step S66 is executed to determine whether any key in the plurality of second type keys 224 is pressed.

When one key in the plurality of second type keys 224 is pressed, step S67 is executed to look for the second scan code 29 corresponding to the pressed key.

Next, step S68 is executed to send out the second scan code 29 corresponding to the pressed key to the host system 10 for further processing.

The present invention thus finishes the key conditions detection process for the plurality of second type keys 224.

Although in the flowchart shown in FIG. 6, the key condition detection process for the plurality of first type keys 222 (which is from step S61 to step S64) is preformed first and then the key condition detection process for the plurality of second type keys 224 (which is from step S65 to step S68) is performed later, these two processes can be performed in another sequence or both at the same time.

Figure 7:
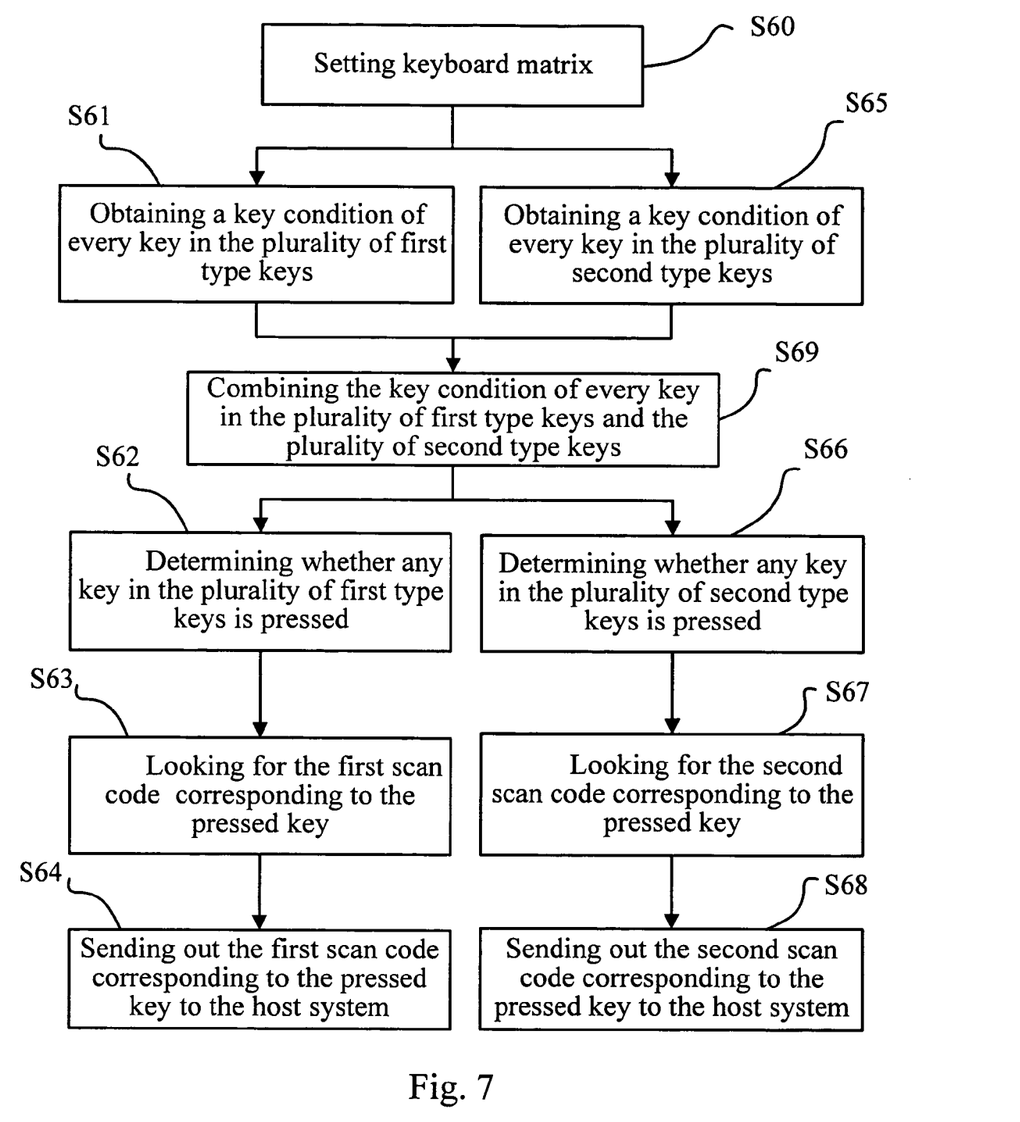
FIG. 7 is another flowchart of a detecting method for key conditions according to the present invention.

Please refer to FIG. 7. FIG. 7 is another flowchart of a detection method for key conditions according to the present invention that performs the key condition detection process for the plurality of first type keys 222 and the key condition detection process for the plurality of second type keys 224 at the same time. In an embodiment of the present invention, the detection method further comprises step S69, which is used for combining the key condition of every key in the plurality of first type keys 222 and the key condition of every key in the plurality of second type keys 224 to determine whether any key in the plurality of first type keys 222 (step S62) is pressed and whether any key in the plurality of second type keys 224 is pressed (step S66).

The plurality of first type keys 222 in the present invention are identical to the prior art technology, where one key corresponds to one matrix position, whereas the plurality of second type keys 224 are different from the prior art technology since more than one keys correspond to one matrix position. Therefore, how the plurality of second type keys 224 correspond to the keyboard matrix 24 and the key detection method are considerations of the present invention.

Figure 8:
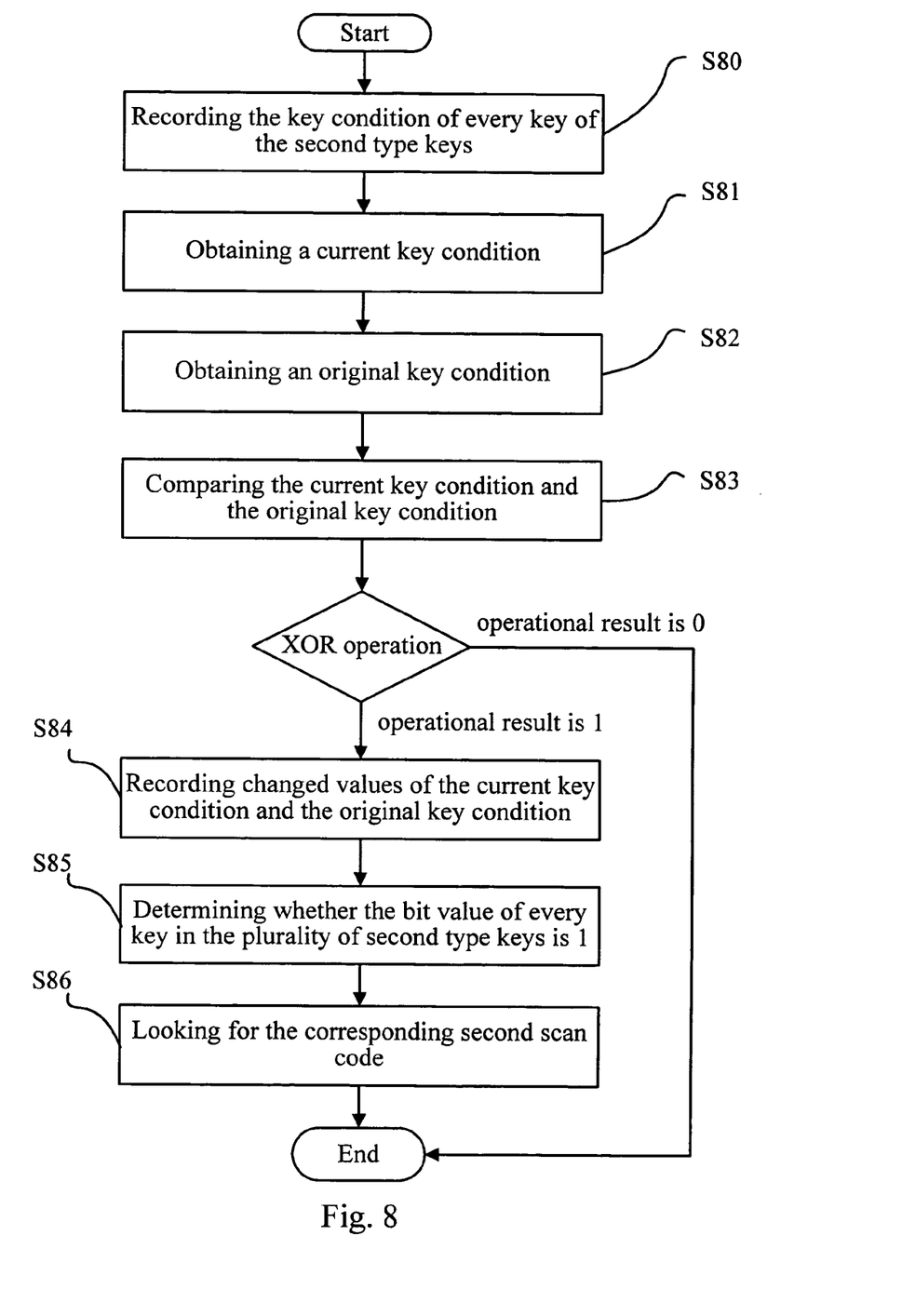
FIG. 8 is a flowchart for detecting key conditions for a second type keys according to the present invention.

Please refer to FIG. 8. FIG. 8 is a flowchart of detecting key conditions of second type keys 224 according to the present invention (from step S65 to step S68, as shown in FIG. 6).

Figure 9:
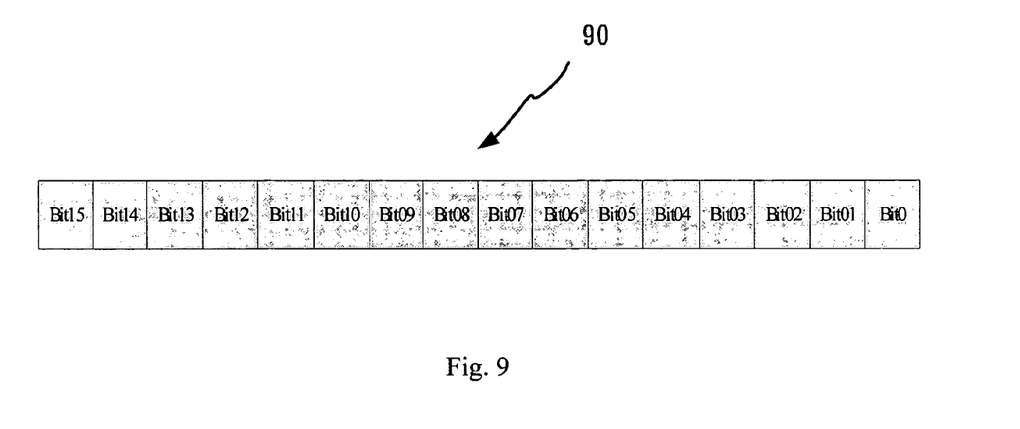
FIG. 9 shows a key condition list of the second type keys according to the present invention.

FIG. 9 shows a key condition list of the second types of keys according to the present invention. As shown in FIG. 8, step S80 is executed, and a key condition list 90 is used for recording the key condition of every key of the 16 second type keys 224. Every bit in the key condition list 90 indicates the key condition of one second type key 224; when one second type key 224 is pressed, the corresponding bit will have a value change between 0 and 1. In an embodiment of the present invention, a hardware device (not shown) can be used to obtain the values in the key condition list 90, but this is not the point of the present invention and so requires no further description.

Step S81 is executed to obtain a current key condition of every key in the plurality of second type keys 224, and step S82 is executed to obtain an original key condition of every key in the plurality of second type keys 224.

After obtaining the current key condition and the original key condition, step S83 is executed to compare the current key condition and the original key condition to determine whether these two have changed. If the key condition is different, the bit value of this matrix position will be changed; in step S83 an XOR operation can be performed on the current key condition and the original key condition.

When the operational result is 0, then the current key condition and the original key condition have not changed, and no second type key 224 is pressed, and the detection process is finished.

When the operational result is 1, then current key condition and the original key condition have changed, and the bit value of the matrix position 127 of the keyboard matrix 24 will be changed, which indicates there is/are second type keys 224 pressed. Step S84 is executed to record changed values of the current key condition and the original key condition.

Since 16 second type keys 224 all correspond to one matrix position 127, when the bit value of the matrix position 127 is changed, it means there is/are keys in 16 of the second type keys 224 being pressed. However, a further process needs to be performed to determine which key is pressed.

The following description explains how to determine which second type key 224 is pressed.

First, step S85 is executed to determine whether corresponding values of these 16 second type keys 224 in the key condition list 90 are 1. If there is one bit value of the second type keys 224 that is 1, then a second type key 224 is pressed. After determining all 16 second type keys 224, step S86 is executed to record the second type key 224 with the bit value 1 and determine the corresponding second scan code of this second type key 224 for further processing, which may include executing the command inputted by the user or displaying the character inputted by the user.

Although the present invention has been explained in relation to its preferred embodiment, it is to be understood that many other possible modifications and variations can be made without departing from the spirit and scope of the invention as hereinafter claimed.

What is claimed is:

1. A keyboard system comprising:
   a plurality of keys for inputting at least one character, the plurality of keys comprising a plurality of first type keys and a plurality of second type keys, wherein every first type key corresponds to a first scan code, and every second type key corresponds to a second scan code;
   a keyboard matrix comprising a plurality of matrix positions, the plurality of keys corresponding to the plurality of matrix positions, and the at least one character inputted by the plurality of keys is obtainable by scanning the matrix positions; and
   a program for causing the plurality of keys to correspond to the plurality of matrix positions, the program comprising:

a first program code for causing a portion of the matrix positions to correspond to the plurality of first type keys, every matrix position corresponding to one first type key; and a second program code for causing another portion of the matrix positions to correspond to the plurality of second type keys, every matrix position corresponding to more than one second type keys.

2. The keyboard system as claimed in claim 1, wherein the keyboard matrix is composed of a plurality of conductor lines and a plurality of conductor columns, wherein a crossing point of each conductor line and each conductor column defines a matrix position to form the plurality of matrix positions.

3. The keyboard system as claimed in claim 1, wherein the program further comprises:

a third program code for obtaining a key condition of every key in the plurality of first type keys;

a fourth program code for determining whether any key in the plurality of first type keys is pressed;

a fifth program code for looking for the first scan code corresponding to the pressed key in the plurality of first type keys; and a sixth program code for sending out the first scan code corresponding to the pressed key in the plurality of first type keys.

4. The keyboard system as claimed in claim 1, wherein the program further comprises:

a seventh program code for obtaining a key condition of every key in the plurality of second type keys;

an eighth program code for determining whether any key in the plurality of second type keys is pressed;

a ninth program code for looking for the second scan code corresponding to the pressed key in the plurality of second type keys; and a tenth program code for sending out the second scan code corresponding to the pressed key in the plurality of second type keys.

5. The keyboard system as claimed in claim 3, wherein the program further comprises:

a seventh program code for obtaining a key condition of every key in the plurality of second type keys;

an eighth program code for determining whether any key in the plurality of second type keys is pressed;

a ninth program code for looking for the second scan code corresponding to the pressed key in the plurality of second type keys; and a tenth program code for sending out the second scan code corresponding to the pressed key in the plurality of second type keys.

6. The keyboard system as claimed in claim 5, wherein the program further comprises:

an eleventh program code for combining the key condition of every key in the plurality of first type keys and the key condition of every key in the plurality of second type keys, enabling the fourth program code and the eighth program code to determine whether any key in the plurality of first type keys is pressed and whether any key in the plurality of second type keys is pressed.

7. An electronic device comprising:

a host system;

a keyboard system adapted for electrical connection to the host system, the keyboard system comprising:

a plurality of keys for inputting at least one character, the plurality of keys comprising a plurality of first type keys and a plurality of second type keys, wherein every first type key corresponds to a first scan code, and every second type key corresponds to a second scan code; and a keyboard matrix comprising a plurality of matrix positions, the plurality of keys corresponding to the plurality of matrix positions, and a key condition of every key by the plurality of keys is obtainable by scanning the matrix positions;

a program controlled by the host system for causing the plurality of keys to correspond to the plurality of matrix positions, and obtaining a key condition of every key in the plurality of keys, the program comprising:

a first program code for causing a portion of the matrix positions to correspond to the plurality of first type keys, each matrix position corresponding to one first type key; and a second program code for causing another portion of the matrix positions to correspond to the plurality of second type keys, each matrix position corresponding to more than one second type keys; and a display system electrically connected to the host system and keyboard system for displaying the at least one character inputted by the plurality of keys.

8. The electronic device as claimed in claim 7, wherein the keyboard matrix is composed of a plurality of conductor lines and a plurality of conductor columns, wherein a crossing point of each conductor line and each conductor column defines a matrix position to form the plurality of matrix positions.

9. The electronic device as claimed in claim 7, wherein the program further comprises:

a third program code for obtaining a key condition of every key in the plurality of first type keys;

a fourth program code for determining whether any key in the plurality of first type keys is pressed;

a fifth program code for looking for the first scan code corresponding to the pressed key in the plurality of first type keys; and a sixth program code for sending out the first scan code corresponding to the pressed key in the plurality of first type keys.

10. The electronic device as claimed in claim 7, wherein the program further comprise:

a seventh program code for obtaining a key condition of every key in the plurality of second type keys;

an eighth program code for determining whether any key in the plurality of second type keys is pressed;

a ninth program code for looking for the second scan code corresponding to the pressed key in the plurality of second type keys; and a tenth program code for sending out the second scan code corresponding to the pressed key in the plurality of second type keys to the host system.

11. The electronic device as claimed in claim 9, wherein the program further comprises:

a seventh program code for obtaining a key condition of every key in the plurality of second type keys;

an eighth program code for determining whether any key in the plurality of second type keys is pressed;

a ninth program code for looking for the second scan code corresponding to the pressed key in the plurality of second type keys; and a tenth program code for sending out the second scan code corresponding to the pressed key in the plurality of second type keys to the host system.

12. The electronic device as claimed in claim 11, wherein the program further comprises:

an eleventh program code for combining the key condition of every key in the plurality of first type keys and the key condition of every key in the plurality of second type keys, enabling the fourth program code and the eighth program code to determine whether any key in the plurality of first type keys is pressed and whether any key in the plurality of second type keys is pressed.

13. A detecting method for key conditions for an electronic device, the electronic device comprising a keyboard system, the keyboard system comprising a plurality of first type keys, a plurality of second type keys and a keyboard matrix, wherein every first type key corresponds to a first scan code, every second type key corresponds to a second scan code, and the keyboard matrix comprises a plurality of matrix positions; the method comprising:

setting the keyboard matrix to cause a portion of the matrix positions to correspond to the plurality of first type keys, each matrix position corresponding to one first type key; and another portion of the matrix positions corresponding to the plurality of second type keys, each matrix position corresponding to more than one second type keys.

14. The method as claimed in claim 13 further comprising:

obtaining a key condition of every key in the plurality of second type keys;

determining whether any key in the plurality of second type keys is pressed;

looking for the second scan code corresponding to the pressed key in the plurality of second type keys; and sending out the second scan code corresponding to the pressed key in the plurality of second type keys.

15. The method as claimed in claim 14 further comprising:

obtaining a key condition of every key in the plurality of first type keys;

determining whether any key in the plurality of first type keys is pressed;

looking for the first scan code corresponding to the pressed key in the plurality of first type keys; and sending out the first scan code corresponding to the pressed key in the plurality of first type keys.

16. The method as claimed in claim 15 further comprising:

combining the key condition of every key in the plurality of first type keys and the key condition of every key in the plurality of second type keys to determine whether any key in the plurality of first type keys is pressed and whether any key in the plurality of second type keys is pressed.

17. The method as claimed in claim 14, wherein the step of obtaining a key condition of every key in the plurality of second type keys further comprises:

obtaining a current key condition of every key in the plurality of second type keys; and obtaining an original key condition of every key in the plurality of second type keys.

18. The method as claimed in claim 17, wherein the step of determining whether any key in the plurality of second type keys is pressed further comprises:

comparing the current key condition and the original key condition to determine whether these two have changed;

if they have not, ending the detection method; and if they have, recording change values of the current key condition and the original key condition.

19. The method as claimed in claim 18, wherein in the step of comparing the current key condition and the original key condition, an XOR operation is performed on the current key condition and the original key condition, an operational result of 1 indicating that the current key condition and the original key condition have changed.

20. The method as claimed in claim 19, wherein in the step of looking for the second scan code corresponding to the pressed key, the second scan code corresponding to the pressed key in the plurality of second type keys has an operational result of 1.

* * * * *